United States Patent [19]

Thornton

[11] Patent Number: 5,062,115
[45] Date of Patent: Oct. 29, 1991

[54] HIGH DENSITY, INDEPENDENTLY ADDRESSABLE, SURFACE EMITTING SEMICONDUCTOR LASER/LIGHT EMITTING DIODE ARRAYS

[75] Inventor: Robert L. Thornton, East Palo Alto, Calif.

[73] Assignee: Xerox Corporation, Stamford, Conn.

[21] Appl. No.: 636,524

[22] Filed: Dec. 28, 1990

[51] Int. Cl.[5] .............................................. H01S 3/19
[52] U.S. Cl. ...................................... 372/50; 372/45; 357/17
[58] Field of Search ................ 372/50, 45, 46; 357/17

[56] References Cited

U.S. PATENT DOCUMENTS

| | | | |
|---|---|---|---|
| 4,706,255 | 11/1987 | Thornton et al. | 372/50 |
| 4,727,557 | 2/1988 | Burnham et al. | 372/80 |
| 4,831,629 | 5/1989 | Paoli et al. | 372/50 |
| 4,870,652 | 9/1989 | Thornton | 372/50 |
| 4,987,468 | 1/1991 | Thornton | 372/45 |

Primary Examiner—Georgia Epps
Attorney, Agent, or Firm—William Propp

[57] ABSTRACT

A high density surface emitting semiconductor LED array comprises disordered regions extending through a contact layer, a second confinement layer, an active layer and partially extending through a first confinement layer to define optical cavities therebetween the disordered regions, individual contacts on the contact layer aligned with each disordered region inject current through the optical cavity to a contact on a substrate causing emission of light from the active layer in the optical cavity through the surface of the contact layer. The first confinement layer can be replaced with a DBR to form an enhanced LED array. Both confinement layers can be replaced with DBRs to form a laser array. The first confinement layer can be replaced with a distributed Bragg reflector (DBR) and a dielectric mirror stack can be formed on the contact layer to form a laser array.

19 Claims, 3 Drawing Sheets

HIGH DENSITY, INDEPENDENTLY ADDRESSABLE, SURFACE EMITTING SEMICONDUCTOR LASER/LIGHT EMITTING DIODE ARRAYS

BACKGROUND OF THE INVENTION

This invention relates to a surface emitting semiconductor laser/light emitting diode structure and, more particularly, to a high density surface emitting semiconductor structure with independently addressable individual light emitting elements.

The ability to fabricate closely spaced, or high density, independently addressable laser and light emitting diode (LED) sources is important for many applications such as optical disk technology, laser printing and scanning, optical interconnection and fiber optic communications.

Individually, semiconductor light emitting diodes and semiconductor lasers may have insufficient power for some of those applications. Arrays of semiconductor light emitting diodes or semiconductor lasers can be used to increase the power output, provide parallel processing, and to simplify optical system design. To provide and maintain good optical alignment of the light emitting elements of the array with one another and to minimize the assembly involved, arrays have been fabricated so that the light emitting elements are on a single semiconductor substrate.

One problem with such arrays is maintaining the electrical and optical isolation between the individual light emitting elements. Another problem is increasing the density of the light emitting elements in the substrate by closely spacing the elements together while still maintaining the isolation, avoiding heat dissipation problems, and providing precise alignment of the elements.

Another problem is making each individual light emitting element in the array independently addressable. As the light emitting elements are spaced closer together in higher densities, it is progressively more difficult to separately, individually and independently cause each element to emit light.

Typical laser and LED sources have been edge emitters. The light is emitted from the edge of a monolithic structure of semiconductor layers. An alternative construction is surface emitters where the light is emitted from the surface of the monolithic structure of semiconductor layers.

Surface emitting semiconductor light sources have several potential advantages over edge emitters. The light emitting surface of a surface emitter is larger than that of an edge emitter, therefore the power generated by a surface emitter is larger than that of an edge emitter. And the power needed to cause emission of light is less for a surface emitter than an edge emitter. Surface emitting LEDs are more efficient than edge emitting LEDs because of that larger emitting area. Fabrication of surface emitting lasers can be less complex than fabrication of edge emitting lasers since the cleaving and mirror passivation needed for edge emitters are eliminated.

It is an object of this invention, therefore, to provide a high density array of light source surface emitters on a single substrate.

It is a further object of this invention to provide a means for independent addressing of the individual laser or light emitting diode elements in this high density array.

SUMMARY OF THE INVENTION

In accordance with the present invention, a high density surface emitting semiconductor LED array comprises a first confinement layer and a substrate of one conductivity type, an active layer, a second confinement layer and a contact layer of an opposing conductivity type. Disordered regions extend from the contact layer through to the first confinement layer defining optical cavities therebetween. Individual contacts on the contact layer aligned with each disordered region inject current through the optical cavity to the contact on the substrate causing emission of light from the active layer in the optical cavity through the surface of the contact layer.

The first confinement layer can be replaced with a distributed Bragg reflector (DBR) to form an enhanced LED array. Both confinement layers can be replaced with DBRs to form a laser array. The first confinement layer can be replaced with a distributed Bragg reflector (DBR) and a dielectric mirror stack can be formed on the contact layer to form a laser array.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
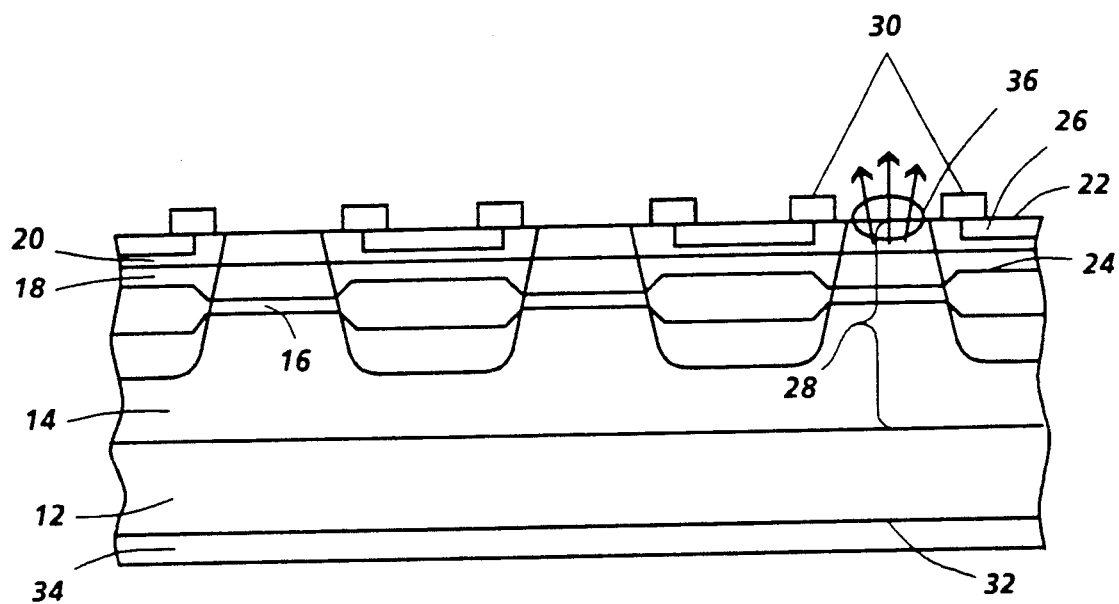
FIG. 1 is a schematic illustration of a side view of a high density, independently addressable, surface emitting, semiconductor LED array formed according to this invention.

Reference is now made to FIG. 1, wherein there is illustrated a high density, independently addressable, surface emitting, semiconductor light emitting diode (LED) array 10 of this invention.

LED array 10 comprises a substrate 12 of n-GaAs upon which is epitaxially deposited a first confinement layer 14 of n-$Al_xGa_{1-x}As$; an active layer 16 of non-doped GaAs for providing light wave generation and propagation, a second confinement layer 18 of p-$Al_yGa_{1-y}As$ where $x=$ or $\neq y$ and a contact layer 20 of p-GaAs. The semiconductor material of the active layer 16 should have a narrow bandgap while the semiconductor material of the confinement layers 14 and 18 should have a wide bandgap. The second confinement layer 18 and the contact layer 20 should also have a doping level as low as possible without introducing unnecessary resistance so that the layers are transparent to the light generated in the active layer. The substrate, on the other hand, should be heavily doped to increase electrical conductivity.

Since the second confinement layer 18 and the contact layer 20 are both p-type conductivity, that side of the LED array from the active layer is referred to as the p-side of the LED array. Similarly, since the first confinement layer 14 and the substrate 12 are both n-type conductivity, that side of the LED array from the active layer is referred to as the n-side of the LED array.

The active layer may, in the alternative, be nondoped or p-type doped or n-type doped; GaAs, $Al_yGa_{1-y}As$ or $(Al_xGa_{1-x})_{0.5}In_{0.5}P$; or a relatively thin conventional double heterostructure (DH) active layer; or a single quantum well, such as GaAs or $Al_yGa_{1-y}As$ where y is very small and $y < x$; or a multiple quantum well superlattice, such as alternating layers of GaAs and $Al_yGa_{1-y}As$ where $y < x$ or alternating layers of $Al_wGa_{1-w}As$ and $Al_BGa_{1-B}As$ where $B < w < x$ with a second confinement layer 18 of $p-Al_zGa_{1-z}As$ where $B < w < z$; or a separate single or multiple quantum well structure in a separate confinement cavity.

As is known in the art, the epitaxial growth of LED array 10 may be carried out by molecular beam epitaxy (MBE) or metalorganic chemical vapor deposition (MOCVD). The substrate 12 may be 100 microns thick. Confinement layers 14 and 18 may each have a thickness in the range of 0.1 to 1 micron. Active layer 16 may be a thin conventional layer having a thickness of 50 to 300 nanometers or may be comprised of a superlattice structure of quantum wells which may be 3 to 50 nanometers thick. Contact layer 20 may have a thickness in the range of 100 to 1000 angstroms.

There are alternate conventional techniques and diffusion/implant species for carrying out the desired disordering or the elemental implant/annealing technique. Discussion hereafter will be confined to impurity induced disordering. However, it should be noted that these other techniques and elemental diffusions or implants are equally applicable.

Upon completion of the epitaxial growth, a $Si_3N_4$ mask is formed on the top surface 22 of the contact layer 20 with openings exposing regions of the semiconductor structure to impurity induced disordering. The mask protects the unexposed regions which will form the LED which can be circular, elliptical, square, parallelogramal, trapezoidal, triangular or any desired shape or size.

The light emitting areas are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 850° C. and is maintained for a sufficiently long period of time, e.g. seven to eight hours, to penetrate contact layer 20, second confinement layer 18 and active layer 16 and partially penetrate first confinement layer 14.

The diffusion of silicon through the contact layer 20 of p-GaAs into the active layer 16 and the confinement layers 14 and 18 causes an intermixing of Ga and Al in the active layer 16 as well as the confinement layers 14 and 18, thereby forming a n-impurity induced disordered region 24. The processing of the LED array is done from just one side, the p-side, of the LED array.

Upon completion of the impurity induced disordering steps, electrically insulating regions 26 are formed in the disordered regions 24 by proton implantation through the top surface 22 to provide a level of electrical isolation of the LED light emitting areas which allows independent addressability of each individual light emitting area.

Between the disordered regions 24 in the semiconductor LED array are the LED light emitting areas 28 consisting of the nondisordered sections of the contact layer 20, second confinement layer 18, the active layer 16 and the first confinement layer 14. The disordered regions, optically and electrically, isolate and separate the light emitting areas. The light emitting areas are shaped by the confinement layers in the vertical direction and the shape of the disordered regions in the horizontal direction.

Standard chemical etching means or other techniques are employed to form metal contacts 30 of Cr-Au or Ti-Pt-Au on the top surface 22 of contact layer 20. Each contact is aligned with each disordered region 24. Each contact is either partially aligned or not aligned with the electrically insulating regions 26 of each disordered region. In the Figure, the contacts are annular in shape, but shown in cross-section, circumscribing the nondisordered contact layer 20 and the LED light emitting area 28 beneath. The contacts 30 are referred to as p-contacts since they are on the p-side of the LED array.

The bottom surface 32 of the substrate 12 is also metallized with alloyed Au-Ge, followed by Cr-Au or Ti-Pt-Au, to form a substrate contact 34. The substrate contact covers the entire bottom surface of the substrate under all of the disordered regions and is referenced to ground. The substrate contact 34 is referred to as the n-contact since it is on the n-side of the LED array.

Current is injected between the p-contact 30 and the n-contact 34 to forward-bias the p-n junction of p-confinement layer 18 and n-confinement layer 14 to cause the active layer 16 to emit light 36 from the light emitting area 28. The current is injected substantially parallel to the LED light emitting area, through the p-contact 30, the p-contact layer 20, p-confinement layer 18, active layer 16 of the individual light emitting area, and then spreads in the n-confinement layer 14 into the substrate 12 and out the n-contact 34.

The ground or n-contact is common to all the light emitting areas. However, each light emitting area or LED element contains a p-n junction that is separately biased through its p-contact from all the others. Since each p-contact is positively biased with respect to ground, current flows only from each p-contact to ground. The electrically isolating regions and the disordered regions prevents any single p-contact from causing adjacent light emitting areas to emit light. Flow between different p-contacts does not occur because any small potential difference between the addressed p-contact and a neighboring p-contact corresponds to a reverse voltage on the neighboring p-contact.

The light is emitted through the emitter surface area 36, substantially perpendicular to the top surface 22 of the contact layer 20, hence LED array 10 is a surface emitting LED. The thickness of the substrate 12 and the substrate contact 30 prevent light from being emitted by the optical cavity through the n-side of the LED array.

The shape of the emitter surface area and the resulting emitted light is determined by the shape of the LED light emitting areas which can be circular, elliptical, square, parallelogramal, trapezoidal, triangular or any desired shape or size. In the present Figure, although shown in cross-section the emitter surface areas are circular circumscribed by the annular p-contact. The emitted light itself can be either continuous wave or pulse.

Typically, the LED array 10 has an operating current of about 10 milliamperes with an output power of about 30 microwatts per individual light emitting element.

The p-GaAs contact layer 20 may be removed by chemical etching or other means from the emitter surface area 36 of the LED light emitting area exposing the second confinement layer 18 therebeneath to facilitate light emission. The emitter surface area can be coated with an antireflective coating, such as a thin (30 nanometer) layer of $Al_2O_3$ to facilitate light emission.

Figure 2:
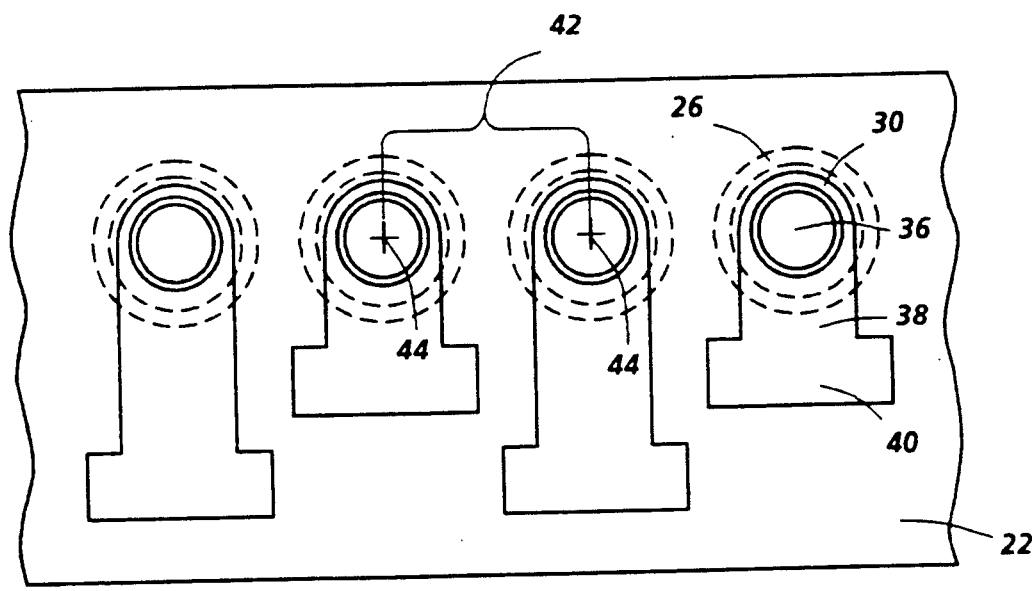
FIG. 2 is a schematic illustration of the top view of the LED array of FIG. 1.

FIG. 2 is the top view of the LED array of FIG. 1, showing the top surface 22 of the contact layer, with a linear array of circular emitter surface areas 36 of the LED light emitting areas where the light is emitted through the contact layer surface within the annular p-contacts 30. The annular ring of the p-contact is connected by a contact strip 38 to a power pad 40 to provide current to each individual LED element, making each LED element separately and independently addressable. The contact strips and attached power pads are along the same side of the top surface of the contact layer. The contact strip and power pad can be formed at the same time and by the same method as the p-contacts or by other means known to those of skill in the art.

The electrically insulating regions 26, as shown by the dotted line in the Figure, are also annular in shape, circumscribing the annular p-contacts and the circular emitter surface areas. The contact strip has been deposited over the insulating region to allow current to flow from the power pad to the p-contact.

With an approximate one micron diameter of the circular emitter surface areas 36, the spacing 42 from the center 44 of one individual LED element to the center 44 of the next LED element as measured from the emitter surface areas is approximately 2½ to 3 microns which provides for a high density of LEDs in the array. The impurity induced disordering provides accurate center to center spacing of the individual LED elements.

Figure 3:
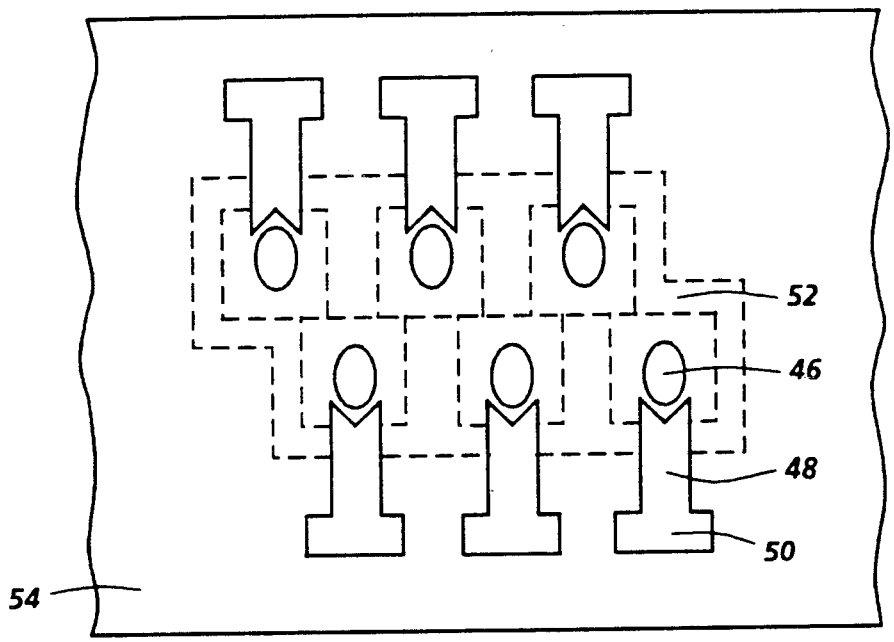
FIG. 3 is a schematic illustration of the top view of an alternate embodiment of a high density, independently addressable, surface emitting, semiconductor LED array formed according to this invention.

The circular nature of the emitter surface area, the annular shapes of the p-contact and the electrically insulating regions, and the linearity of the emitter surface areas are merely illustrative examples. As shown in FIG. 3, the emitter surface areas 46 can be elliptical with finger p-contact strips 48 connected to power pads 50. The finger contacts need only be on one side of the emitter surface area and within the square electrically insulating region 52 (in dotted lines). The finger contacts and power pads need not be on the same side of the contact layer 54.

The spacing from one individual LED element to the next individual LED element can be approximately 2 microns with the use of finger contacts as opposed to annular ring contacts. Similarly, the staggered or offset array of emitter surface areas in the Figure also provides a higher density of LED elements.

The shape of the emitter surface area is determined by the shape of the LED light emitting areas which can be circular, elliptical, square, parallelogramal, trapezoidal, triangular or any desired shape or size. The electrically insulating regions can also be of any shape and need not be the same shape as the p-contact. The electrically insulating regions can even overlap their edges.

The p-contact can also either follow the shape of the emitter surface area, or not follow the shape, or merely contact less than the perimeter of the shape of the emitter surface area. The only practical geometric concern is that the p-contact be within the electrically insulating region contacting the disordered region. The p-contact, strip contact and connected power pad can be pattern designed on the contact layer as is known in the semiconductor art.

The driver circuitry for the p-contacts and the necessary bonding pads can be fabricated on a silicon chip, not shown, placed flush against the top surface of the LED array. The silicon chip would be optically transparent to the light emission from the surface of the LED array or would have an appropriate hole or trench etched in the chip so as to permit the light transmission. Alternatively, electronic driver circuitry can be fabricated on the semiconductor LED array or separate and adjacent to the array or on or in the substrate of the semiconductor array.

Figure 4:
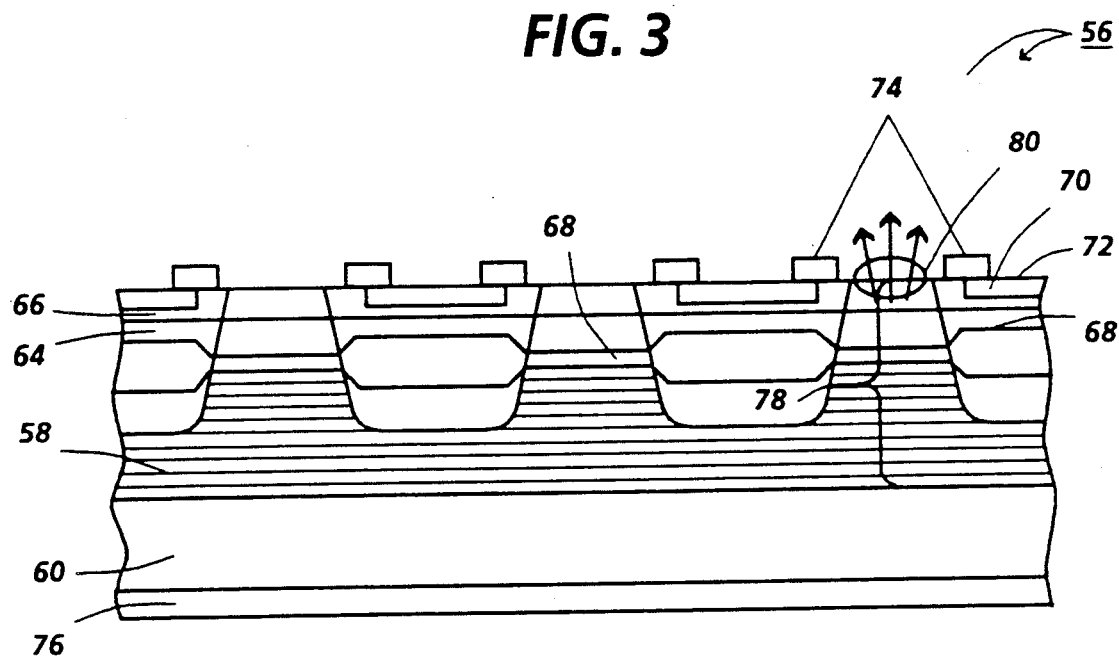
FIG. 4 is a schematic illustration of a side elevation of an enhanced, high density, independently addressable, surface emitting, semiconductor LED array with a DBR formed according to this invention.

In FIG. 4, enhanced LED array 56 is of identical structure to the LED array 10 of FIG. 1, except that the n-confinement layer 14 of FIG. 1 has been replaced by a distributed Bragg reflector (DBR) 58 in FIG. 4.

Thus, the LED array 56 comprises a substrate 60 of n-GaAs upon which is epitaxially deposited a n-DBR 58 of alternating layers of $n-Al_xGa_{1-x}As$ and $n-Al_yGa_{1-y}As$ where $x \neq y$, an active layer 62 of nondoped GaAs for providing light wave generation and propagation, a confinement layer 64 of $p-Al_zGa_{1-z}As$ where $z \neq x$ or y and a contact layer 66 of p-GaAs.

N-impurity induced disordered regions 68 are formed in the enhanced LED array 56 extending through portions of the contact layer 66, the p-confinement layer 64, the active layer 62 and the n-DBR 58. Electrically insulating regions 70 are formed in the disordered regions 68 through the top surface 72 of the contact layer 66. P-contacts 74 are formed on the contact layer 66 aligned with each disordered region 68 and a n-contact 76 is formed on the substrate 60.

Between the disordered regions 68 in the enhanced LED array 56 are the enhanced LED light emitting area 78 consisting of the nondisordered sections of the contact layer 66, the p-confinement layer 64, the active layer 62 and the n-DBR 58. The n-DBR is constructed to have a reflectivity as close to one as possible.

The light is emitted through the emitter surface area 80, substantially perpendicular to the top surface 72 of the contact layer 66. The n-DBR reflects the light being emitted by the optical cavity toward the n-side of the LED array back through the surface area on the p-side of the LED array, thus enhancing the amount of light emission of the LED array.

Typically, the enhanced LED array 56 has an operating current of about 10 milliamperes with an output power of about 60 microwatts.

Figure 5:
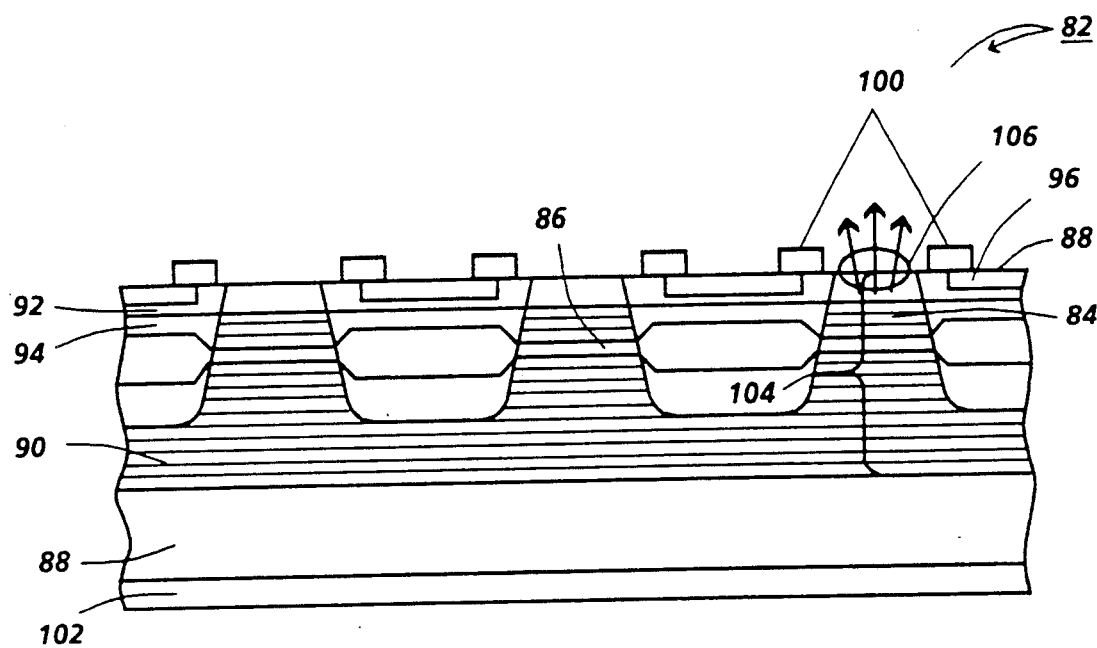
FIG. 5 is a schematic illustration of a side elevation of a high density, independently addressable, surface emitting, semiconductor laser array formed according to this invention.

In FIG. 5, laser array 82 is of identical structure to the enhanced LED array 56 of FIG. 4, except that the p-confinement layer 64 of FIG. 4 has been replaced by a distributed Bragg reflector (DBR) 84 in FIG. 5 and that active layer 62 of FIG. 4 which provides lightwave generation and propogation has been replaced by active layer 86 in FIG. 5 which provides lightwave generation and propogation under lasing conditions.

Thus, the laser array 82 comprises a substrate 88 of n-GaAs upon which is epitaxially deposited a n-DBR 90 of alternating layers of n-Al$_x$Ga$_{1-x}$As and n-Al$_y$Ga$_{1-y}$As where x≠y, an active layer 86 of nondoped GaAs for providing light wave generation and propagation under lasing conditions, a p-DBR 84 of alternating layers of p-Al$_a$Ga$_{1-a}$As and p-Al$_b$Ga$_{1-b}$As where a≠b, and a contact layer 92 of p-GaAs.

N-impurity induced disordered regions 94 are formed in the laser array 82 extending through portions of the contact layer 92, the p-DBR 84, the active layer 86 and the n-DBR 90. Electrically insulating regions 96 are formed in the disordered regions 94 through the top surface 98 of the contact layer 92. P-contacts 100 are formed on the contact layer 92, aligned with each disordered region 94 and a n-contact 102 is formed on the substrate 88.

Between the disordered regions 94 in the laser array 82 are the laser optical cavity regions 104 consisting of the nondisordered sections of the contact layer 92, the p-DBR 84, the active layer 86 and the n-DBR 90. The n-DBR is constructed to have a reflectivity as close to one as possible while the p-DBR is constructed with a reflectivity close to one but less than that of the n-DBR.

The light is emitted through surface area 106, substantially perpendicular to the top surface 98 of the contact layer 92. Since the light is from a laser optical cavity, it is, of course, coherent. The emitted light can be either continuous wave or pulse.

Typically, the laser array 82 has a threshold current of 1 to 5 milliamperes and an operating current of about 10 milliamperes with an output power of about 1 to 3 milliwatts. Threshold currents of less than 1 milliampere are also possible for the laser array.

Figure 6:
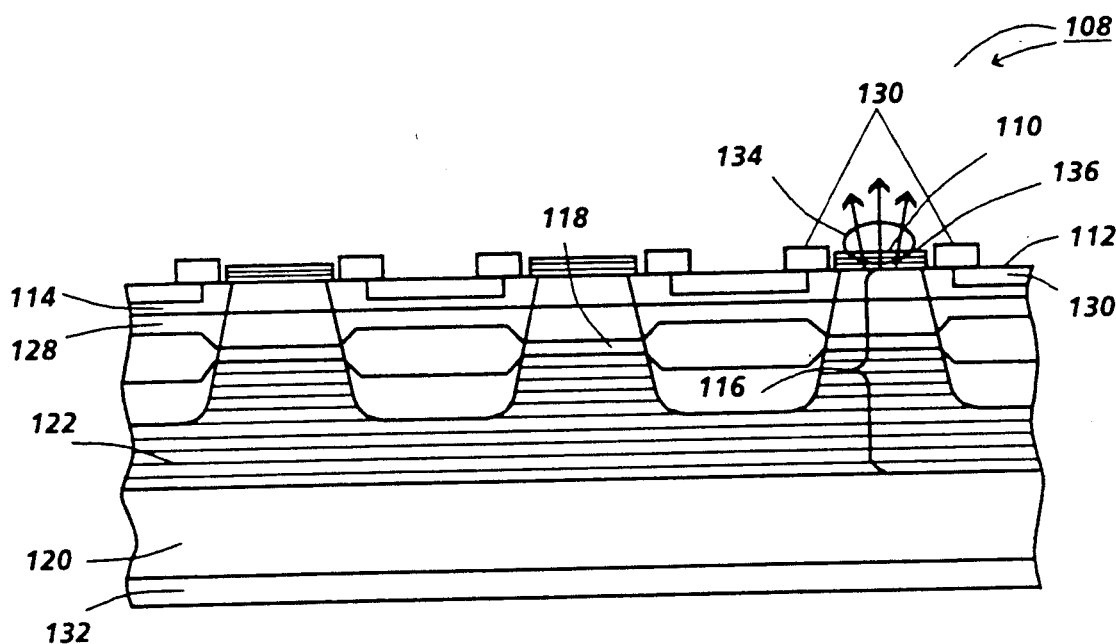
FIG. 6 is a schematic illustration of a side elevation of an alternate embodiment of a high density, independently addressable, surface emitting, semiconductor laser array with a dielectric mirror stack formed according to this invention.

In FIG. 6, laser array 108 is of identical structure to the enhanced LED array 56 of FIG. 4, except that a dielectric mirror stack 110 has been formed on the top surface 112 of the contact layer 114, aligned with and part of the optical cavity 116 in FIG. 6 which replaces the light emitting area 78 in FIG. 4 and that active layer 62 of FIG. 4 which provides lightwave generation and propogation has been replaced by active layer 118 in FIG. 6 which provides lightwave generation and propogation under lasing conditions.

Thus, the laser array 108 comprises a substrate 120 of n-GaAs upon which is epitaxially deposited a n-DBR 122 of alternating layers of n-Al$_x$Ga$_{1-x}$As and n-Al$_y$Ga$_{1-y}$As where x≠y, an active layer 118 of nondoped GaAs for providing light wave generation and propagation under lasing conditions, a confinement layer 124 of p-Al$_z$Ga$_{1-z}$As where z≠x or y and a contact layer 126 of p-GaAs.

N-impurity induced disordered regions 128 are formed in the laser array 108 extending through portions of the contact layer 126, the p-confinement layer 124, the active layer 118 and the n-DBR 122. Electrically insulating regions 130 are formed in the disordered regions 128 through the top surface 112 of the contact layer 114.

The dielectric mirror stack 110 may be formed on the top surface 112 of the contact layer 114 by vapor deposition. The stack 110 is composed of six alternating layers of quarter wavelength thick Al$_2$O$_3$ and Si, which will form an overall thickness of the dielectric mirror stack of approximately 5 thousand angstroms. The stack is aligned with the nondisordered section of the contact layer 114. P-contacts 130 are formed on the contact layer 126 aligned with each disordered region 128 and a n-contact 132 is formed on the substrate 120.

Between the disordered regions 68 in the enhanced LED array 56 are the laser optical cavity 116 consisting of the dielectric mirror stack 110 and the nondisordered sections of the contact layer 126, the p-confinement layer 124, the active layer 118 and the n-DBR 122. The n-DBR is constructed to have a reflectivity as close to one as possible while the dielectric mirror stack is constructed with a reflectivity close to one but less than that of the n-DBR.

The light is emitted through the emitter surface area 134, substantially perpendicular to the top surface 136 of the dielectric mirror stack 110. Since the light is from a laser optical cavity, it is, of course, coherent. The emitted light can be either continuous wave or pulse.

In the alternative, the dielectric mirror stack is generally composed of alternating layers of two different materials that also differ in refractive index, as is known in the art. Other materials would include alternating layers of GaAs and GaAlAs or alternating layers of SiO$_2$ and TiO$_2$.

The emitter surface areas of the various surface emitting LED, enhanced LED and laser array embodiments in this present application can be etched to form Fresnel lenses to diverge, collimate, focus or otherwise optically modify the emitted light. A micro lens array can be positioned adjacent to the surface emitting areas to similarly optically modify the emitted light. A transparent refractive layer can be deposited between the p-confinement layer or p-DBR and the contact layer to diverge the emitted light. The semiconductor surface emitting laser/light emitting diode arrays can also be formed into two-dimensional arrays.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A high density, surface emitting, semiconductor light emitting diode (LED) array comprising:
   a first semiconductor confinement layer deposited on a substrate, said first confinement layer and said substrate having the same conductivity type,
   an active semiconductor layer deposited on said confinement layer, said active layer providing lightwave generation and propogation,
   a second semiconductor confinement layer deposited on said active layer, said second confinement layer having an opposing conductivity type to said first confinement layer and said substrate,
   a semiconductor contact layer deposited on said second confinement layer, said contact layer and said second confinement layer having the same conductivity type,
   disordered regions extending through said contact layer, said second confinement layer, said active layer and at least partially through said first confinement layer, said disordered regions having an opposing conductivity type to said contact layer and said second confinement layer, contacts formed on said contact layer, one of said contacts aligned with each of said disordered regions, at least one contact formed on said substrate, and optical cavities formed between said disordered regions, such that current injected between one of said contacts on said contact layer and said at least one contact on said substrate will cause light emission from one of said optical cavities through the surface of said contact layer.

2. The high density, surface emitting, semiconductor light emitting diode (LED) array of claim 1 wherein said substrate, said first confinement layer and said disordered regions have n-type conductivity and said second confinement layer and said contact layer have p-type conductivity.

3. The high density, surface emitting, semiconductor light emitting diode (LED) array of claim 1 wherein said optical cavities comprises the nondisordered contact layer, the nondisordered second confinement layer, the nondisordered active layer and the nondisordered first confinement layer between adjacent said disordered regions.

4. The high density, surface emitting, semiconductor light emitting diode (LED) array of claim 1 wherein portions of said contact layer where said light is emitted through said surface of said contact layer are removed to expose said second confinement layer therebeneath.

5. The high density, surface emitting, semiconductor light emitting diode (LED) array of claim 1 wherein an electrically insulating region is formed on each of said disordered regions, either partially aligned or not aligned with said contact formed subsequently.

6. A high density, surface emitting, semiconductor light emitting diode (LED) array comprising:

alternating semiconductor layers deposited on a substrate, said alternating layers forming a distributed Bragg reflector (DBR), said DBR and said substrate having the same conductivity type, an active semiconductor layer deposited on said DBR, said active layer providing lightwave generation and propogation, a semiconductor confinement layer deposited on said active layer, said confinement layer having an opposing conductivity type to said DBR and said substrate, a semiconductor contact layer deposited on said confinement layer, said contact layer and said confinement layer having the same conductivity type, disordered regions extending through said contact layer, said confinement layer, said active layer and at least partially through said DBR, said disordered regions having an opposing conductivity type to said contact layer and said confinement layer, contacts formed on said contact layer, one of said contacts aligned with each of said disordered regions, at least one contact formed on said substrate, and optical cavities formed between said disordered regions, such that current injected between one of said contacts on said contact layer and said at least one contact on said substrate will cause light emission from one of said optical cavities through the surface of said contact layer.

7. The high density, surface emitting, semiconductor light emitting diode (LED) array of claim 6 wherein said substrate, said DBR and said disordered regions have n-type conductivity and said confinement layer and said contact layer have p-type conductivity.

8. The high density, surface emitting, semiconductor light emitting diode (LED) array of claim 6 wherein said optical cavities comprises the nondisordered contact layer, the nondisordered confinement layer, the nondisordered active layer and the nondisordered DBR between adjacent said disordered regions.

9. The high density, surface emitting, semiconductor light emitting diode (LED) array of claim 6 wherein portions of said contact layer where said light is emitted through said surface of said contact layer are removed to expose said confinement layer therebeneath.

10. The high density, surface emitting, semiconductor light emitting diode (LED) array of claim 6 wherein an electrically insulating region is formed on each of said disordered regions, either partially aligned or not aligned with said contact formed subsequently.

11. A high density, surface emitting, semiconductor laser array comprising:

alternating semiconductor layers deposited on said substrate, said alternating layers forming a first distributed Bragg Reflector (DBR), said first DBR and said substrate having the same conductivity type, an active semiconductor layer deposited on said first DBR, said active layer providing lightwave generation and propogation under lasing conditions, alternating semiconductor layers deposited on said active layer, said alternating layers forming a second distributed Bragg Reflector (DBR), said second DBR having an opposing conductivity type to said first DBR and said substrate, a semiconductor contact layer deposited on said second DBR, said contact layer and said second DBR having the same conductivity type, disordered regions extending through said contact layer, said second DBR, said active layer and at least partially through said first DBR, said disordered regions having an opposing conductivity type to said contact layer and said second DBR, contacts formed on said contact layer, one of said contacts aligned with each of said disordered regions, at least one contact formed on said substrate, and optical cavities formed between said disordered regions, such that current injected between one of said contacts on said contact layer and said at least one contact on said substrate will cause light emission from one of said optical cavities through the surface of said contact layer.

12. The high density, surface emitting, semiconductor laser array of claim 11 wherein said substrate, said first DBR and said disordered regions have n-type conductivity and said second DBR and said contact layer have p-type conductivity.

13. The high density, surface emitting, semiconductor laser array of claim 11 wherein said optical cavities comprises the nondisordered contact layer, the nondisordered second DBR, the nondisordered active layer and the nondisordered first DBR between adjacent said disordered regions.

14. The high density, surface emitting, semiconductor laser array of claim 11 wherein portions of said contact layer where said light is emitted through said surface of said contact layer are removed to expose said second DBR therebeneath.

15. The high density, surface emitting, semiconductor laser array of claim 11 wherein an electrically insulating region is formed on each of said disordered regions, either partially aligned or not aligned with said contact formed subsequently.

16. A high density, surface emitting, semiconductor laser array comprising:

alternating semiconductor layers deposited on a substrate, said alternating layers forming a distributed Bragg reflector (DBR), said DBR and said substrate having the same conductivity type, an active semiconductor layer deposited on said DBR, said active layer providing lightwave generation and propogation, a semiconductor confinement layer deposited on said active layer, said confinement layer having an opposing conductivity type to said DBR and said substrate, a semiconductor contact layer deposited on said confinement layer, said contact layer and said confinement layer having the same conductivity type, disordered regions extending through said contact layer, said confinement layer, said active layer and at least partially through said DBR, said disordered regions having an opposing conductivity type to said contact layer and said confinement layer, dielectric mirrors formed on said nondisordered contact layer, contacts formed on said contact layer, one of said contacts aligned with each of said disordered regions, at least one contact formed on said substrate, and optical cavities formed between said disordered regions, such that current injected between one of said contacts on said contact layer and said at least one contact on said substrate will cause light emission from one of said optical cavities through the surface of said dielectric mirrors.

17. The high density, surface emitting, semiconductor light emitting diode (LED) array of claim 16 wherein said substrate, said DBR and said disordered regions have n-type conductivity and said confinement layer and said contact layer have p-type conductivity.

18. The high density, surface emitting, semiconductor light emitting diode (LED) array of claim 16 wherein said optical cavities comprises the dielectric mirror, nondisordered contact layer, the nondisordered confinement layer, the nondisordered active layer and the nondisordered DBR between adjacent said disordered regions.

19. The high density, surface emitting, semiconductor light emitting diode (LED) array of claim 16 wherein an electrically insulating region is formed on each of said disordered regions, either partially aligned or not aligned with said contact formed subsequently.

* * * * *